United States Patent
Hirano

(10) Patent No.: US 9,924,617 B2
(45) Date of Patent: Mar. 20, 2018

(54) INFORMATION PROCESSING DEVICE AND SERVER

(71) Applicant: FUJITSU LIMITED, Kawasaki-shi, Kanagawa (JP)

(72) Inventor: Yukihiro Hirano, Fucyu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 15/359,002

(22) Filed: Nov. 22, 2016

(65) Prior Publication Data

US 2017/0245397 A1    Aug. 24, 2017

(30) Foreign Application Priority Data

Feb. 22, 2016    (JP) .................................. 2016-030582

(51) Int. Cl.
*H05K 7/20*    (2006.01)

(52) U.S. Cl.
CPC ..... *H05K 7/20809* (2013.01); *H05K 7/20254* (2013.01)

(58) Field of Classification Search
CPC ........... H05K 7/20218; H05K 7/20254; H05K 7/20327; H05K 7/20436

USPC ....... 361/699, 700–703, 707; 165/80.4–80.5, 165/104.33; 257/714

See application file for complete search history.

(56) References Cited

FOREIGN PATENT DOCUMENTS

| JP | 2-224265 | 9/1990 |
| JP | 2007-266518 | 10/2007 |

*Primary Examiner* — Dion R Ferguson
*Assistant Examiner* — Amir Jalali
(74) *Attorney, Agent, or Firm* — Fujitsu Patent Center

(57) ABSTRACT

An information processing device includes: a device main body including a cooling plate; and a heat generating unit including a heat generating element and a contact plate thermally coupled to the heat generating element, the heat generating unit being detachable from the device main body, wherein the cooling plate includes a heat transfer spring configured to come into contact with the contact plate, the heat transfer spring includes a spring portion configured to come into elastic contact with the contact plate, and a thermally conductive portion disposed between a surface of the spring portion on an opposite side from a contact surface of the spring portion that comes into contact with the contact plate, and the cooling plate.

15 Claims, 12 Drawing Sheets

FIG. 12

|  | THERMAL RESISTANCE (°C/W) | THERMAL CONDUCTIVITY (W/m·K) |
|---|---|---|
| MEASUREMENT 1 | 0.5 | 2.0 |
| MEASUREMENT 2 | 0.07 | 15.0 |
| MEASUREMENT 3 | 3.8 | 0.27 |

INFORMATION PROCESSING DEVICE AND SERVER

CROSS-REFERENCE TO RELATED APPLICATION

This application is based upon and claims the benefit of priority of the prior Japanese Patent Application No. 2016-030582, filed on Feb. 22, 2016, the entire contents of which are incorporated herein by reference.

FIELD

The embodiment discussed herein is related to an information processing device and a server.

BACKGROUND

As increases in performance, increases in functionality, and reductions in size of information processing devices such as servers and the like are promoted, the heat generation density of electronic parts such as central processing units (CPUs) or the like used in the information processing devices is increased.

A related technology is disclosed in Japanese Laid-open Patent Publication No. 2007-266518 or Japanese Laid-open Patent Publication No. 02-224265.

SUMMARY

According to an aspect of the embodiment, an information processing device includes: a device main body including a cooling plate; and a heat generating unit including a heat generating element and a contact plate thermally coupled to the heat generating element, the heat generating unit being detachable from the device main body, wherein the cooling plate includes a heat transfer spring configured to come into contact with the contact plate, the heat transfer spring includes a spring portion configured to come into elastic contact with the contact plate, and a thermally conductive portion disposed between a surface of the spring portion on an opposite side from a contact surface of the spring portion that comes into contact with the contact plate, and the cooling plate. The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 illustrates an example of a result of measurements of thermal resistance and thermal conductivity.

DESCRIPTION OF EMBODIMENT

A water cooling system may be adopted for cooling an information processing device that includes an electronic part having a high heat generation density (which will hereinafter be referred to also as a "heat generating element"), for example.

In the information processing device of the water cooling system, a part referred to as a cooling plate is attached onto the heat generating element such as a CPU or the like. A flow passage through which a refrigerant flows is provided within the cooling plate. A cooling device and the cooling plate are coupled to each other by a hose. The heat generating element is cooled by supplying cooling water or another refrigerant from the cooling device to the cooling plate.

For example, a server may be used in which a CPU and a peripheral circuit of the CPU are unitized, and formed so as to be insertable into and removable from a server main body. A unit into which the CPU and the peripheral circuit of the CPU are unitized will hereinafter be referred to as a CPU unit.

In this kind of server, a cooling plate is attached to a CPU unit side, and the CPU and the cooling plate is thermally coupled to each other via a thermally conductive sheet or the like. After the CPU unit is inserted into the server main body, the cooling plate and cooling water piping (a water supply passage and a discharge passage) provided within a rack is coupled to each other by a hose.

For example, a heat dissipating mechanism employing a spring may be used.

In the above-described server, the cooling plate is attached to the CPU unit side. Thus, the CPU unit may be large in size and heavy in weight. In addition, at a time of maintenance and inspection of the CPU unit, the hose is removed from the cooling plate before the CPU unit is taken out from the server main body. Therefore, maintenance and inspection work for the above-described server may be complicated.

An information processing device for which easy maintenance and inspection work is performed may be provided.

Figure 1:
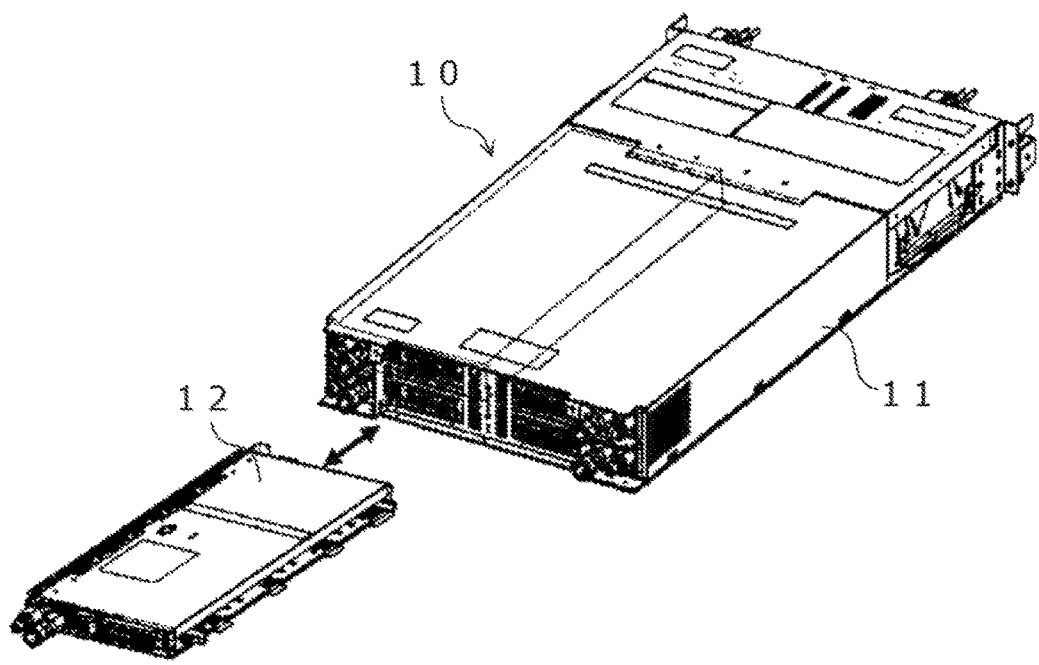
FIG. 1 illustrates an example of a perspective view of a server.
Figure 2:
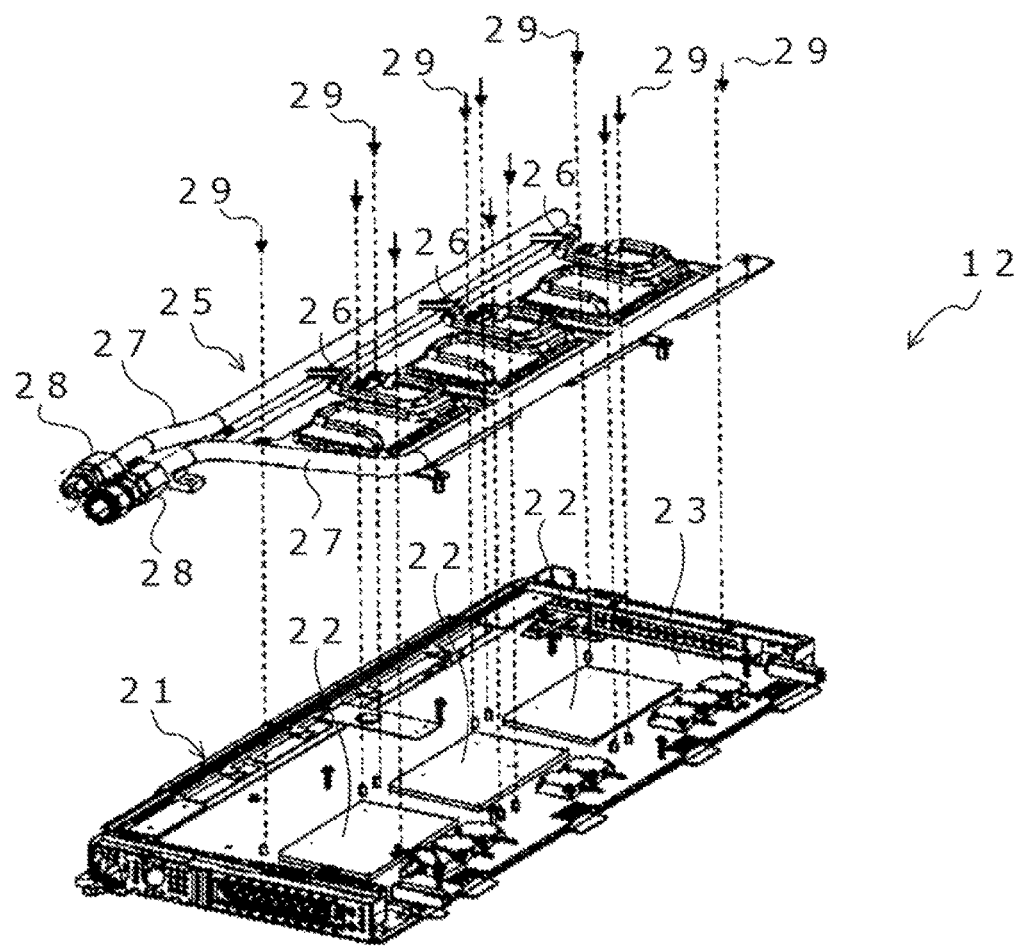
FIG. 2 illustrates an example of an exploded view of a CPU unit.

FIG. 1 illustrates an example of a perspective view of a server. FIG. 2 illustrates an example of an exploded view of a CPU unit.

A server 10 illustrated in FIG. 1 includes a server main body 11 and a CPU unit 12 insertable into and removable from a slot provided in the server main body 11.

The server main body 11 includes a power supply unit, an input-output interface, and the like. When the CPU unit 12 is inserted into the slot of the server main body 11, a circuit within the CPU unit 12 and a circuit within the server main body 11 are electrically coupled to each other via a connector.

As illustrated in FIG. 2, the CPU unit 12 includes a unit main body 21 and a cooling unit 25. The unit main body 21 houses a wiring board 23 on which one or a plurality of CPUs 22 (three in the example of FIG. 2) are mounted.

The cooling unit 25 includes cooling plates 26 substantially equal in number to the number of the CPUs 22 and piping 27 for making cooling water or another refrigerant (hereinafter referred to simply as "cooling water") flow through the cooling plates 26. The piping 27 may include a water supply pipe through which the cooling water to be supplied to the cooling plates 26 passes and a discharge pipe through which the cooling water discharged from the cooling plates 26 passes. End portions of these pieces of the piping 27 are each provided with a coupler 28 for coupling a hose.

As illustrated in FIG. 2, the cooling unit 25 is fixed to the unit main body 21 by a plurality of screws 29. The cooling plates 26 and the CPUs 22 are thermally coupled to each other via a thermally conductive sheet or the like. The piping 27 is coupled via the couplers 28 and the hoses to piping (a water supply pipe and a discharge pipe) for the cooling water which is disposed within a rack.

In the CPU unit 12 illustrated in FIG. 1 and FIG. 2, the cooling unit 25 is integrated with the CPU unit 12. Therefore, the CPU unit 12 is large in size and heavy in weight. It may be difficult to take out the CPU unit 12 from the server main body 11 unless the hoses are removed from the cooling unit 25. Consequently, with the server 10 illustrated in FIG. 1, maintenance and inspection work for the CPU unit 12 may be complicated.

Figure 3:
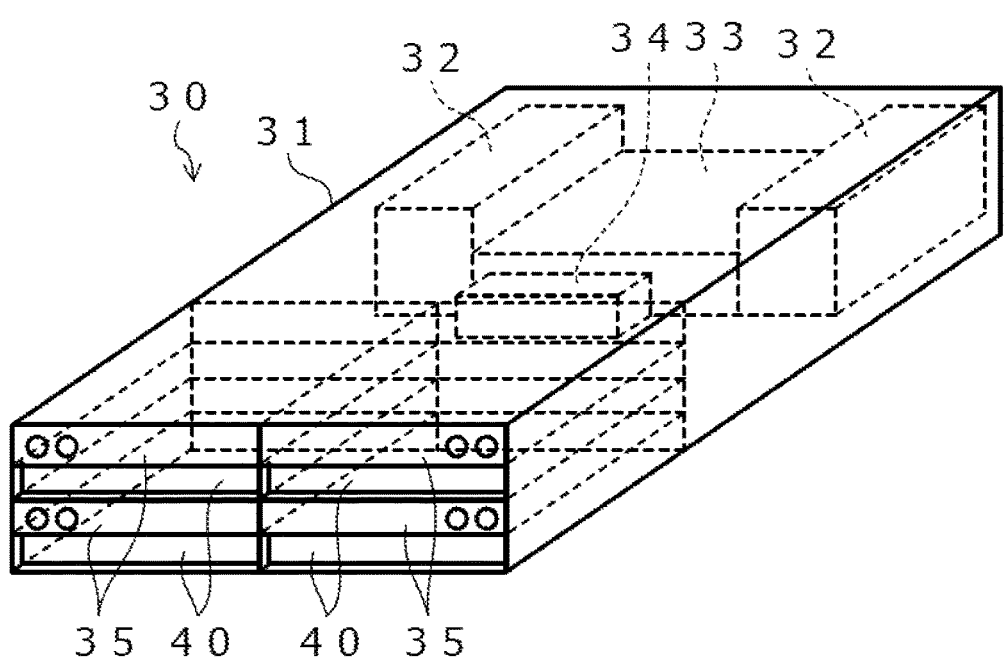
FIG. 3 illustrates an example of a perspective view of an information processing device.
Figure 4:
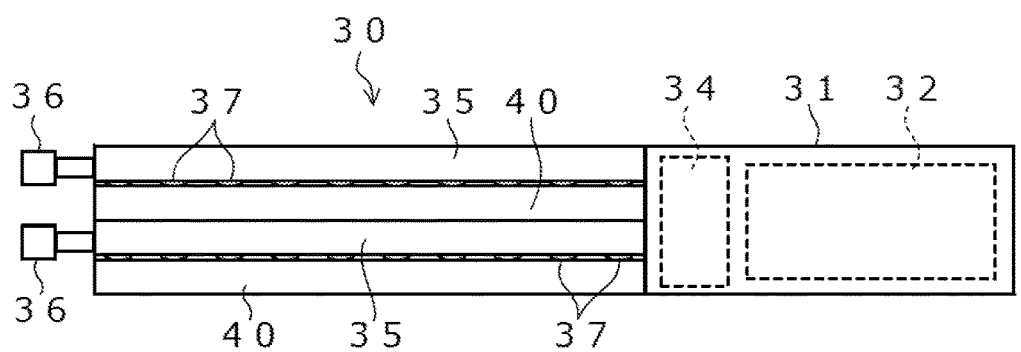
FIG. 4 illustrates an example of a sectional view of an information processing device.

FIG. 3 illustrates an example of a perspective view of an information processing device. FIG. 4 illustrates an example of a sectional view of an information processing device. The information processing device may, for example, be a server.

As illustrated in FIG. 3 and FIG. 4, the server 30 includes a server main body 31 and one or a plurality of CPU units 40 (four in FIG. 3) detachable from (insertable into and removable from) slots provided in the server main body 31.

Figure 8:
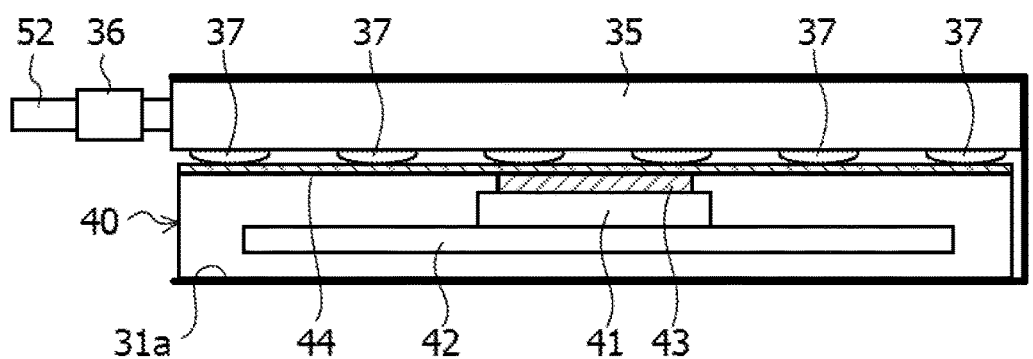
FIG. 8 illustrates an example of a coupled state of a cooling plate and a CPU unit.

A wiring board 42 on which a CPU 41 or the like is mounted is disposed within the CPU unit 40 (see FIG. 8). The server main body 31 may be an example of a device main body. The CPU 41 may be an example of a heat generating element. The CPU unit 40 may be an example of a heat generating unit.

The server main body 31 is provided therewithin with power supply units 32, an input-output interface 33, a fan (ventilator) 34, cooling plates 35, and the like. The cooling plates 35 are arranged over the slots into which the CPU units 40 are inserted.

Figure 5:
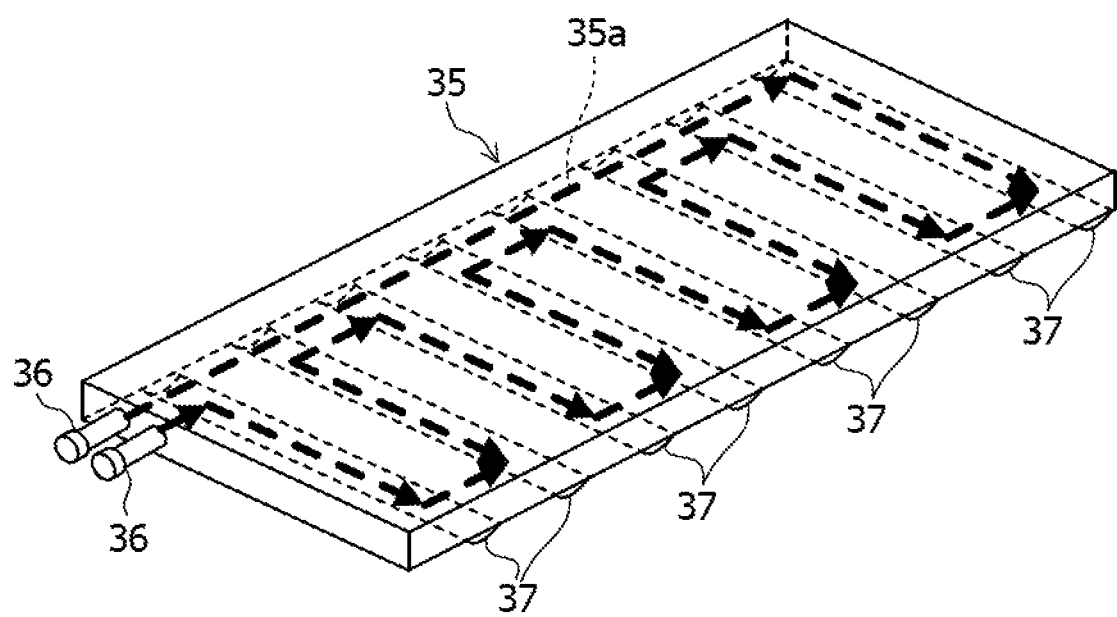
FIG. 5 illustrates an example of a perspective view of a cooling plate.

FIG. 5 illustrates an example of a perspective view of a cooling plate.

The cooling plate 35 includes material having high thermal conductivity, such as copper, aluminum, stainless steel, or the like, and is formed in the shape of a plate. As illustrated in FIG. 5, a cooling water flow passage 35a through which cooling water flows is provided within the cooling plate 35, and couplers 36 for coupling hoses are provided to an inlet and an outlet of the cooling water flow passage 35a. A plurality of heat transfer springs 37 are arranged on the undersurface of the cooling plate 35 at certain intervals along the length direction of the cooling plate 35.

When the CPU unit 40 is inserted into the slot of the server main body 31 as in FIG. 3 and FIG. 4, the CPU unit 40 comes into contact with the heat transfer springs 37 and compresses the heat transfer springs 37, so that the CPU unit 40 and the cooling plate 35 are thermally coupled to each other via the heat transfer springs 37.

Figure 6:
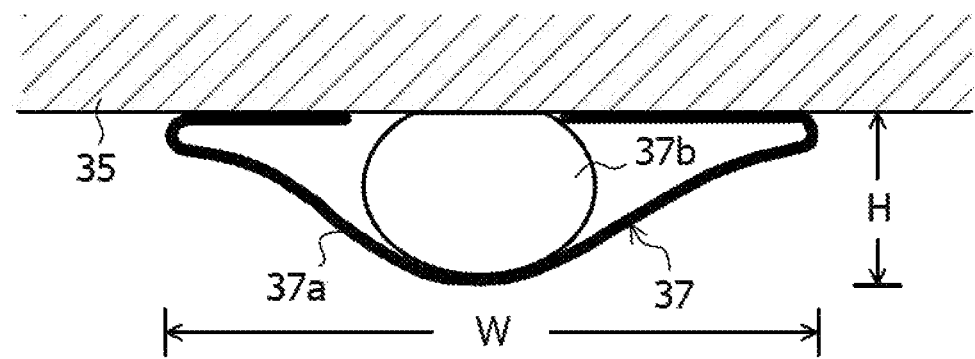
FIG. 6 illustrates an example of a structure of a heat transfer spring.

FIG. 6 illustrates an example of a structure of a heat transfer spring. As illustrated in FIG. 6, the heat transfer spring 37 includes: a spring portion 37a including a thin metallic plate worked into a given shape, for example, a shape such that both ends in a width direction of the spring portion 37a are folded upward and a central portion of the spring portion 37a is projected downward; and a thermally conductive portion 37b disposed within the spring portion 37a.

The heat transfer spring 37 may have a width W of, for example, 15 mm and a height H of, for example, 3 mm. As illustrated in FIG. 5, the heat transfer spring 37 may have a length set to be substantially the same as the width of the cooling plate 35.

One end side or both end sides in the width direction of the spring portion 37a are fixed to the bottom surface of the cooling plate 35 by a screw, welding, or the like. The central portion of the spring portion 37a is in elastic contact with a contact plate 44 of the CPU unit 40 (see FIG. 8).

The spring portion 37a may be made of a material having elasticity and having high thermal conductivity. For example, the spring portion 37a may be made of a beryllium copper plate having a thickness of 0.1 mm.

The thermally conductive portion 37b may include a thermally conductive material (thermal interface material: TIM) having elasticity, and is disposed so as to be in contact with both of an inner central portion of the spring portion 37a and the cooling plate 35.

The thermally conductive portion 37b may include a material having elasticity and having higher thermal conductivity than the spring portion 37a. Materials used for the thermally conductive portion 37b may include, for example, grease, an elastomer sheet (sheet of a polymeric substance having elasticity), room temperature vulcanization rubber (RTV rubber: room temperature curing rubber), gel, a phase change sheet (sheet formed by using a heat dissipating material that makes a phase change according to temperature), and the like. For example, a high thermal conductivity heat dissipating sheet (PT-V) from Polymatech Japan Co., Ltd. may be used as the thermally conductive portion 37b.

The heat transfer springs 37 may be arranged densely to increase efficiency of thermal conduction between the CPU unit 40 and the cooling plate 35. For example, the heat transfer springs 37 may be arranged such that approximately ½ of the undersurface of the cooling plate 35 is covered with the heat transfer springs 37.

Figure 7A:
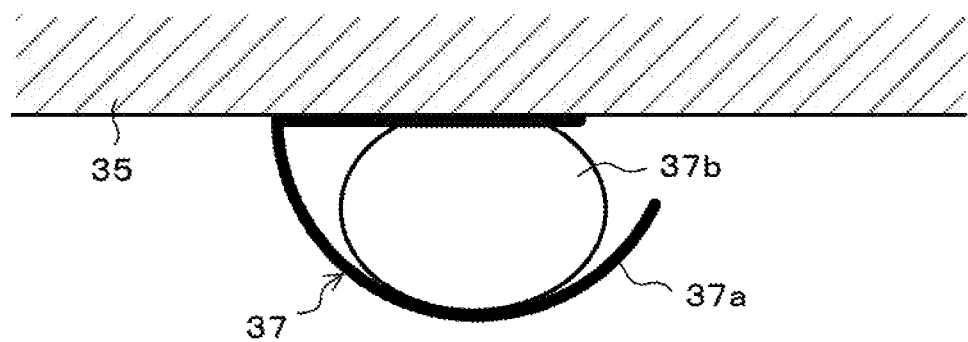
FIG. 7A and FIG. 7B illustrate examples of a heat transfer spring.
Figure 7B:
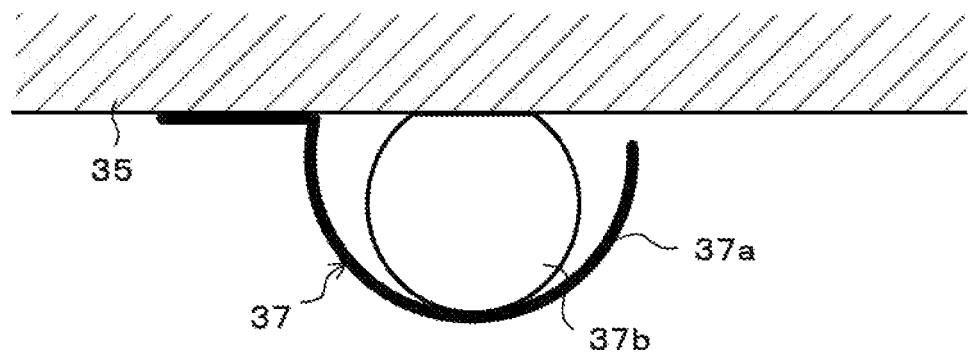

The shape of the heat transfer springs 37 is not limited to the shape illustrated in FIG. 6. The heat transfer springs 37 may have a shape illustrated in FIG. 7A or FIG. 7B, for example. Also in the heat transfer springs 37 illustrated in FIG. 7A and FIG. 7B, the thermally conductive portion 37b is disposed so as to establish a thermal coupling between the surface of the spring portion 37a which is in contact with the CPU unit 40 and the surface of the cooling plate 35 on the opposite side.

FIG. 8 illustrates an example of a coupled state of a cooling plate and a CPU unit.

As illustrated in FIG. 8, the CPU unit 40 includes: the wiring board 42 on which the CPU (heat generating element) 41 and other parts are mounted; and the contact plate 44 that is disposed over the CPU 41 and which covers the whole of an upper portion of the CPU unit 40.

The contact plate 44 may include a material having good thermal conductivity, such as copper, aluminum, stainless steel, or the like. A thermally conductive sheet (or thermally conductive grease) 43 is disposed between the CPU 41 and the contact plate 44.

A reference symbol 31a in FIG. 8 denotes a slot provided in the server main body 31. A reference numeral 52 in FIG. 8 denotes a hose coupling cooling water piping disposed within a rack to the cooling plate 35 (see FIG. 10). FIG. 8 illustrates one CPU 41. However, a plurality of CPUs may be mounted on the wiring board 42, as illustrated in FIG. 2. In that case, the contact plate 44 is coupled to the plurality of CPUs in common.

Figure 9A:
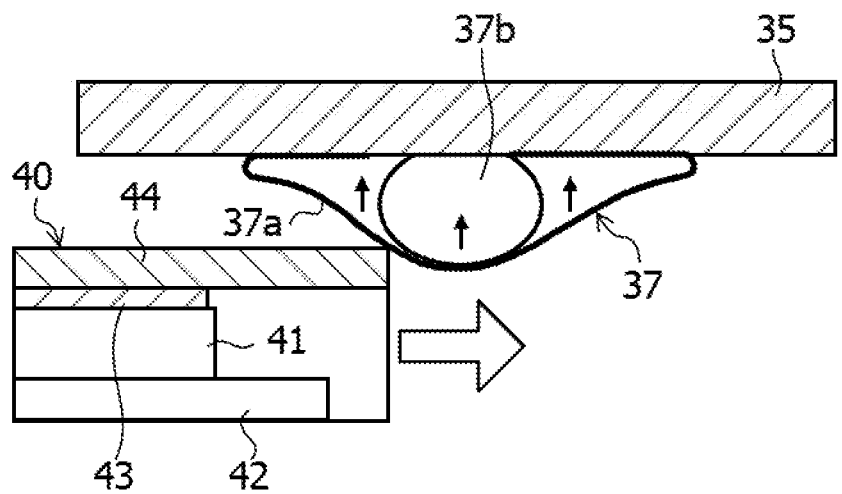
FIG. 9A and FIG. 9B illustrate examples of action when a CPU unit is inserted into a slot of a server main body.
Figure 9B:
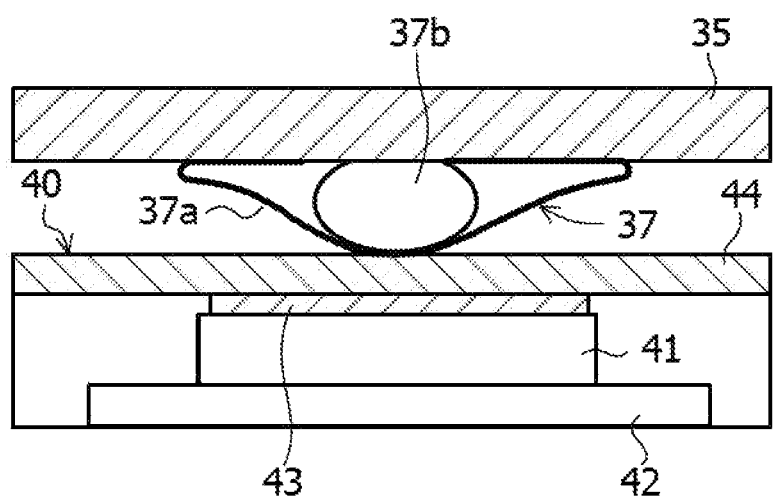

FIG. 9A and FIG. 9B illustrate an example of action when the CPU unit is inserted into the slot of the server main body.

When the CPU unit 40 is inserted into the slot of the server main body 31, an end portion of the CPU unit 40 abuts against the heat transfer spring 37, as in FIG. 9A.

Both sides of the heat transfer spring 37 which are in a direction of inserting and removing the CPU unit 40 are curved. Therefore, when the CPU unit 40 is inserted into the slot of the server main body 31, the contact plate 44 comes into contact with the curved surface of the heat transfer spring 37, and presses the heat transfer spring 37, so that the heat transfer spring 37 is elastically deformed, as illustrated in FIG. 9B. For example, the heat transfer spring 37 is compressed by approximately 1 mm in a height direction by inserting the CPU unit 40 into the slot of the server main body 31.

The heat transfer spring 37 is in close contact with the contact plate 44 with a certain pressure determined by the spring constant of the heat transfer spring 37. The thermally conductive portion 37b having high thermal conductivity and elasticity is disposed inside the heat transfer spring 37. Therefore, a thermal resistance between the CPU unit 40 and the cooling plate 35 is low and stable.

The cooling plate 35 and the CPU unit 40 are thermally coupled to each other via the plurality of heat transfer springs 37. As a result, in the server 30, heat generated in the CPU 41 may quickly move to the cooling plate 35, and the CPU 41 may be cooled sufficiently.

The cooling plate 35 is provided to a server main body 31 side, and no cooling plate is provided to the CPU unit 40 inserted into the slot of the server main body 31. The CPU unit 40 is therefore lighter in weight. The server 30 allows the CPU unit 40 to be taken out from the server main body 31 without the hoses being removed. The server 30 may consequently allow maintenance and inspection work to be performed easily.

Figure 10:
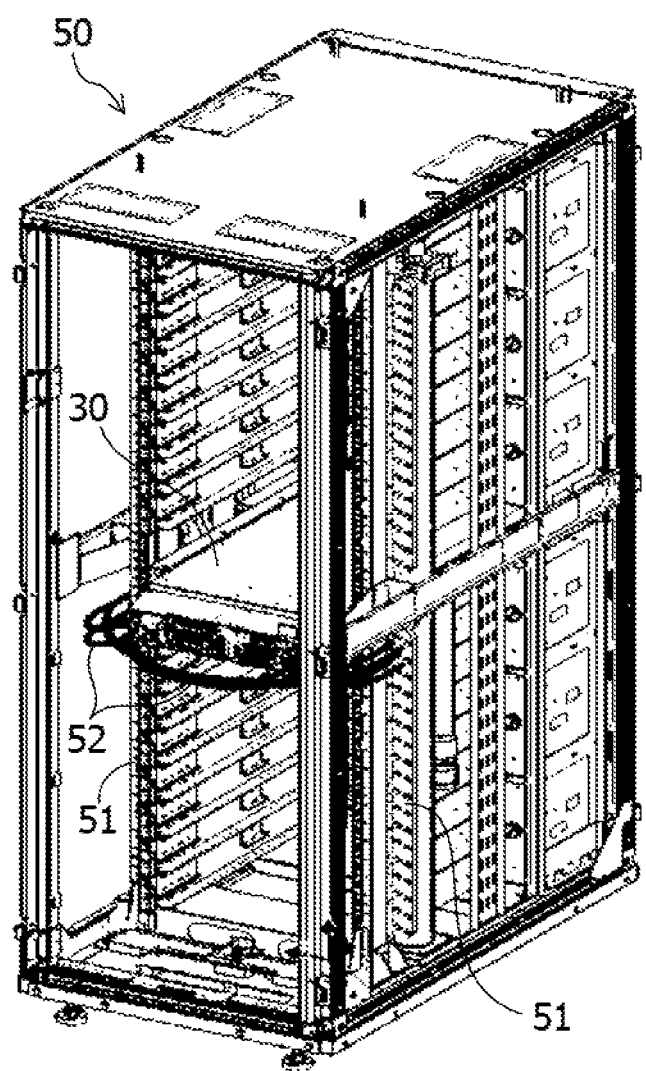
FIG. 10 illustrates an example of a perspective view of a server housed within a rack.

FIG. 10 illustrates an example of a perspective view of a server housed within a rack.

The periphery of the rack is covered with a panel. However, FIG. 10 illustrates a state in which the peripheral panel is removed. The rack houses a plurality of servers in the height direction of the rack. However, FIG. 10 illustrates only one server.

For example, pieces of cooling water piping 51 for water supply and for water discharge are provided within a rack 50. These pieces of the cooling water piping 51 are coupled to a cooling device. The cooling plate 35 (see FIG. 8) of the server 30 is coupled to the cooling water piping 51 via the coupler 36 and the hose 52.

The cooling water supplied from the cooling device passes through the piece of the cooling water piping 51 for water supply and the hose 52, and enters the inside of the cooling plate 35 illustrated in FIG. 5 or FIG. 8. The cooling water cools the cooling plate 35 while passing through the cooling water flow passage 35a of the cooling plate 35. Because the cooling plate 35 and the CPU 41 are thermally coupled to each other via the heat transfer springs 37, the CPU 41 is also cooled as a result of the cooling plate 35 being cooled.

The cooling water whose temperature is raised by cooling the cooling plate 35 passes through the hose 52 and the piece of the cooling water piping 51 for water discharge, and returns to the cooling device. The returned cooling water is cooled by the cooling device, thereafter passed through the piece of the cooling water piping 51 for water supply and the hose 52 within the rack 50 again, and then supplied to the inside of the cooling plate 35.

Thus, in the server 30, the CPU 41 within the CPU unit 40 is cooled.

Figure 11:
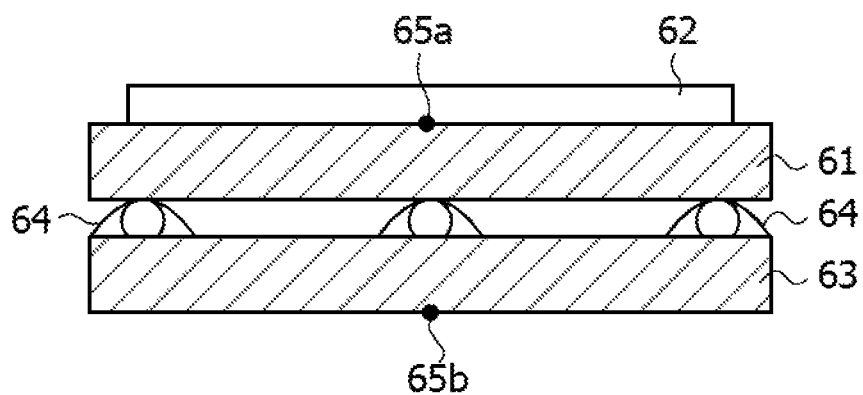
FIG. 11 illustrates an example of a method of measuring thermal resistance and thermal conductivity.

FIG. 11 illustrates an example of a method of measuring thermal resistance and thermal conductivity. As illustrated in FIG. 11, for example, a copper plate 61 whose width and length are both 55 mm is prepared, and a heater 62 is disposed on the copper plate 61. Three heat transfer springs 64 having the shape illustrated in FIG. 6 are arranged at substantially equal intervals on a copper plate 63 having substantially the same size as the copper plate 61. The heat transfer springs 64 may have a width of 15 mm, a length of 55 mm, and a height of 3 mm. Spring portions of the heat transfer springs 64 may be made of a beryllium copper plate having a thickness of 0.1 mm. A high thermal conductivity heat dissipating sheet (PT-V) from Polymatech Japan Co., Ltd. may be used as thermally conductive portions.

The copper plate 61 is disposed on the heat transfer springs 64. The copper plate 61 is pressurized such that the heat transfer springs 64 have a height of 2 mm. Temperature sensors 65a and 65b measured a temperature on the upper side of the copper plate 61 and a temperature on the lower side of the copper plate 63, and thermal resistance and thermal conductivity between the copper plate 61 and the copper plate 63 were obtained. FIG. 12 illustrates an example of a result of measurements of thermal resistance and thermal conductivity. Measurement 1 in FIG. 12 indicates a result of a measurement by the measuring method illustrated in FIG. 11.

A high thermal conductivity heat dissipating sheet (PT-V) was disposed in place of the heat transfer springs 64 between the copper plate 61 and the copper plate 63, and thermal resistance and thermal conductivity were obtained by the measuring method illustrated in FIG. 11. The result is indicated by Measurement 2 in FIG. 12.

The heat transfer springs 64 from which the thermally conductive portions were removed were arranged between the copper plate 61 and the copper plate 63, and thermal resistance and thermal conductivity were obtained by the measuring method illustrated in FIG. 11. The result is indicated by Measurement 3 in FIG. 12.

As illustrated in FIG. 12, Measurement 2 indicates a very low thermal resistance of 0.07° C./W and a very high thermal conductivity of 15.0 W/m·K. Measurement 3 indicates a high thermal resistance of 3.8° C./W and a low thermal conductivity of 0.27 W/m·K.

Measurement 1 indicates a relatively low thermal resistance of 0.5° C./W and a relatively high thermal conductivity of 2.0 W/m·K.

When the CPU unit and the cooling plate are thermally coupled to each other by a high thermal conductivity heat dissipating sheet (PT-V) as in Measurement 2, heat transmission efficiency is increased, but it may be difficult to insert and remove the CPU unit into and from the server main body. When the CPU unit and the cooling plate are thermally coupled to each other by heat transfer springs as described above, thermal conductivity becomes relatively high, and the CPU unit may be insertable into and removable from the server main body.

When the CPU unit 40 tolerates an ambient temperature up to +40° C., for example, a contact plate whose heat quantity is approximately 1300 W may be cooled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing device comprising:
   a device main body including a cooling plate; and
   a heat generating unit including a heat generating element and a contact plate thermally coupled to the heat generating element, the heat generating unit being detachable from the device main body,
   wherein the cooling plate includes a heat transfer spring configured to come into contact with the contact plate, and
   the heat transfer spring includes:
   a spring portion configured to come into elastic contact with the contact plate, and
   a thermally conductive portion disposed between a surface of the spring portion on an opposite side from a contact surface of the spring portion that comes into contact with the contact plate, and the cooling plate.

2. The information processing device according to claim 1, wherein
   the thermally conductive portion thermally couples the contact plate and the cooling plate to each other.

3. The information processing device according to claim 1, wherein
   the thermally conductive portion includes a material having elasticity and a higher thermal conductivity than the spring portion.

4. The information processing device according to claim 1, wherein
   the spring portion includes a metal, and
   the thermally conductive portion includes one kind of grease, an elastomer sheet, room temperature vulcanization rubber, gel, and a phase change sheet.

5. The information processing device according to claim 1, wherein
   the cooling plate is provided with a flow passage through which a refrigerant flows.

6. The information processing device according to claim 1, wherein
   the heat generating unit is inserted into and removed from a slot disposed in the main body of the information processing device.

7. The information processing device according to claim 6, wherein
   both ends of the heat transfer spring that are in a direction of inserting and removing the heat generating unit, are curved.

8. The information processing device according to claim 1, wherein
   the cooling plate includes another heat transfer spring in addition to the heat transfer spring.

9. A server comprising:
   a server main body including a cooling plate;
   at least one slot disposed in the server main body; and
   a heat generating unit removably inserted into the at least one slot and including a heat generating element and a contact plate thermally coupled to the heat generating element,
   wherein the cooling plate includes a heat transfer spring configured to include a spring portion configured to come in contact with the cooling plate at a part, project to a side of the contact plate from the part and come into elastic contact with the contact plate, and a thermally conductive portion disposed between an opposite surface to a contact surface of the spring portion that comes into contact with the contact plate and the cooling plate.

10. The server according to claim 9, wherein
    the thermally conductive portion thermally couples the contact plate and the cooling plate to each other.

11. The server according to claim 9, wherein
    the thermally conductive portion includes a material having elasticity and a higher thermal conductivity than the spring portion.

12. The server according to claim 9, wherein
    the spring portion includes a metal, and
    the thermally conductive portion includes one kind of grease, an elastomer sheet, room temperature vulcanization rubber, gel, and a phase change sheet.

13. The server according to claim 9, wherein
    the cooling plate is provided with a flow passage through which a refrigerant flows.

14. The server according to claim 9, wherein
    both ends of the heat transfer spring that are in a direction of inserting and removing the heat generating unit, are curved.

15. The server according to claim 9, wherein
    the cooling plate includes another heat transfer spring in addition to the heat transfer spring.

* * * * *